US007541636B2

(12) United States Patent
Ranica et al.

(10) Patent No.: US 7,541,636 B2
(45) Date of Patent: Jun. 2, 2009

(54) MEMORY CELL COMPRISING ONE MOS TRANSISTOR WITH AN ISOLATED BODY HAVING A REINFORCED MEMORY EFFECT

(75) Inventors: Rossella Ranica, Grenoble (FR); Alexandre Villaret, Grenoble (FR); Pascale Mazoyer, Domene (FR)

(73) Assignee: STMicroelectronics Crolles SAS, Crolles (FR)

( * ) Notice: Subject to any disclaimer, the term of this patent is extended or adjusted under 35 U.S.C. 154(b) by 317 days.

(21) Appl. No.: 11/479,421

(22) Filed: Jun. 30, 2006

(65) Prior Publication Data

US 2007/0013030 A1    Jan. 18, 2007

(30) Foreign Application Priority Data

Jun. 30, 2005    (FR) ................... 05 51836

(51) Int. Cl.
*H01L 29/78*    (2006.01)
(52) U.S. Cl. .................. 257/314; 257/E29.019; 257/E29.025; 438/294
(58) Field of Classification Search ........... 257/239, 257/E29.019, 314, E29.025; 438/294
See application file for complete search history.

(56) References Cited

U.S. PATENT DOCUMENTS 6,288,425 B1    9/2001    Adan

| 6,661,042 | B2 * | 12/2003 | Hsu ........................... 257/239 |
| 7,061,032 | B2 * | 6/2006 | Kajiyama .................. 257/288 |
| 7,158,410 | B2 * | 1/2007 | Bhattacharyya et al. ................ 365/185.08 |
| 2004/0061148 | A1 | 4/2004 | Hsu |
| 2005/0040463 | A1 | 2/2005 | Wang |
| 2007/0013007 | A1 * | 1/2007 | Kusunoki et al. ........... 257/371 |

OTHER PUBLICATIONS

French Search Report from French Patent Application 05/51836, filed Jun. 30, 2005.
Villaret A. et al., "Mechanisms of Charge Modulation in the Floating Body of Triple-Well nMOSFET capacitor-Less DRAMs" Microelectronic Engineering, Elsevier Publishers BV., Amsterdam, NL, vol. 72, No. 1-4, Apr. 2004, pp. 434-439, XP004499525 ISSN: 0167-9317.
Ranica R. et al., "A One Transistor Cell on Bulk Substrate (1T-bulk) for low-cost and high density e-DRAM" VLSI Technology, 2004. Digest of Technical Papers 2004 Symposium on Honolulu, HI, USA Jun. 15-17, 2004, pp. 128-129, XP010732820 ISBN: 0-7803-8289-7.

* cited by examiner

*Primary Examiner*—Anh Phung
*Assistant Examiner*—Michael Lulis
(74) *Attorney, Agent, or Firm*—Lisa K. Jorgenson; William R. McClellan; Wolf, Greenfield & Sacks, P.C.

(57) ABSTRACT

A memory cell with one transistor on a floating body region isolated by its lower surface by a junction. According to the present invention, the junction is non-planar and, for example, includes a protrusion directed towards the transistor surface.

15 Claims, 3 Drawing Sheets

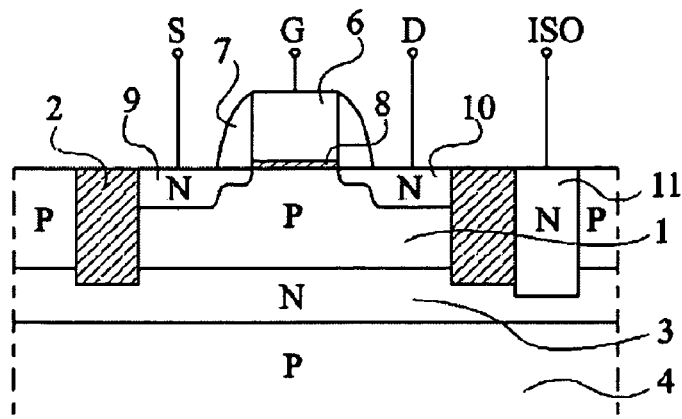
Fig 1
| | $V_{ISO}$ | $V_S$ | $V_D$ | $V_E$ | $I_S(\mu A)$ |
|---|---|---|---|---|---|
| WR1 | 0,4 | 0 | 2 | 1,2 | 20 |
| WR0 | 0,4 | -1,2 | 0 | -1,2 | 0 |
| READ | 0,4 | 0 | 0,4 | 1,2 | 3/16 |
| HOLD | 0,4 | 0 | 0 | 0 | 0 |
| ERASE | 0,4 | -1,2 | 0 | 0 | 0 |
Fig 2
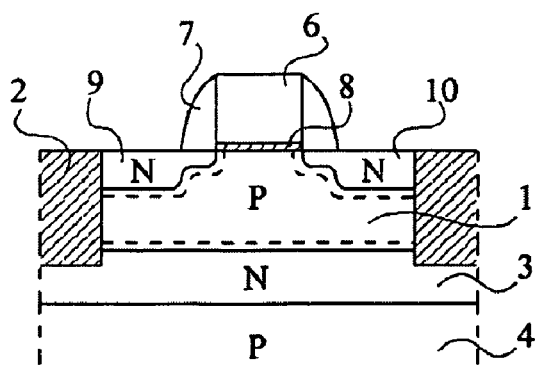
Fig 3A
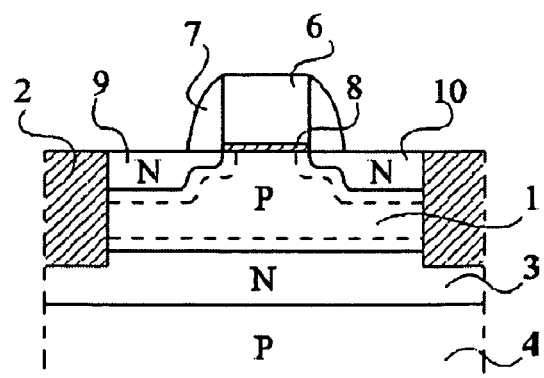
Fig 3B

MEMORY CELL COMPRISING ONE MOS TRANSISTOR WITH AN ISOLATED BODY HAVING A REINFORCED MEMORY EFFECT

BACKGROUND OF THE INVENTION

1. Field of the Invention

The present invention generally relates to DRAM-type memory cells with one transistor formed in a floating body or well delimited depthwise by a junction.

2. Discussion of the Related Art

FIG. 1 is a simplified cross-section view of an example of such a memory cell. This cell comprises an N-channel MOS transistor formed in a floating body region 1 laterally delimited by an isolating ring 2 and, depthwise, by an N-type layer 3 formed in a P-type substrate 4. The MOS transistor comprises, on either side of a gate region 6 surrounded with spacers 7 and resting on a gate insulator 8, N-type source and drain regions 9 and 10. Each of the source and drain regions comprises a deeper more heavily doped region outside of the region defined by spacers 7 and a shallower less heavily doped region under spacers 7.

In the absence of a specific action on the cell, floating body 1 is at a given voltage corresponding to the thermal equilibrium. It has been shown that positive or negative charges could be injected into this body setting the cell in one or the other of two determined states which will be designated as 1 and 0. According to this biasing of the substrate, the threshold voltage of the transistor modifies and states 1 and 0 can thus be distinguished.

Further, FIG. 1 shows an N-type conductive well 11 joining buried layer 3 to enable biasing it. In the drawing, the biasing terminal is called ISO, and buried layer 3 can be called an insulating layer.

FIG. 2 is a table illustrating the voltages to be applied to the cell in various operation modes thereof. Voltages VISO to be applied to buried layer 3, VS to be applied to the source, VD to be applied to the drain, and VG to be applied to the gate, have more specifically been indicated. In the right-hand column, the conduction current of the transistor measured in these various states, designated as IS and expressed in microamperes while all the voltages are expressed in volts, has been indicated. More specifically, states of writing of a 1 (WR1), of writing of a 0 (WR0), of reading (READ), of holding or retaining (HOLD), and of erasing (ERASE) have been distinguished. The values given in this table are given as an example only and correspond to a specific technology. The relative values of the various voltages and their biasings should essentially be considered. The given example corresponds to a technology in which the minimum possible dimension of a pattern is on the order of 0.12 µm, and in which a gate length on the order of 0.30 µm and a depth of STI insulation regions 2 on the order of 0.35 µm, as well as a gate oxide thickness on the order of 6 nm, have been selected.

Thus, the main states of the cell are the following.

Writing of a 1 (WR1). The MOS transistor is set to a relatively high conduction state (currents on the order of 20 µA). This state can be established for a very short time only, for example, on the order of a few nanoseconds. At the end of this state, when all the applied voltages are brought back to zero, except the buried layer voltage which is preferably maintained at a slightly positive value, for example, 0.4 volt, the memory cell is in the state illustrated in FIG. 3A, that is, positive charges have been stored in the floating body. Once the memory cell is at the thermal equilibrium state, the charges tend, as illustrated, to narrow the space charge areas. The transistor then has a low threshold voltage, that is, in a read state in which the transistor is lightly biased to be conductive, a first current (16 µA in the illustrated example) will be observed for a given gate voltage.

Writing of a 0 (WR0). The transistor is off, its gate being set to a negative voltage, and its source (or its drain) is also set to a negative voltage, whereby the positive charges possibly present in the substrate are eliminated and negative charges are injected after the setting to the conductive state of the body-source or body-drain diode. At the end of this state, as illustrated in FIG. 3B, the space charge areas tend to be wider, which results in an increase in the transistor threshold voltage. Thus, in read conditions in which the transistor is lightly biased to the conductive state, a current lower than the current at state 1(3 µA instead of 16 µA in the illustrated example) is obtained for a same 1.2-V gate voltage as that considered in the previous case.

Reading (READ). The MOS transistor is set to a slightly conductive state, the drain for example only being at a voltage on the order of 0.4 V to limit injections likely to deprogram the transistor. The current flowing through transistor MOS is measured or, preferably, compared with a reference value ranging between the current values corresponding to states 1 and 0.

Holding (HOLD). No voltage is applied to the transistor. The voltage applied to buried layer 3 is preferably maintained slightly positive to better block the junction between the isolated body and the buried layer in the case where the transistor is programmed at state 1.

Erasing (ERASE). The source/body (or drain/body) junction is biased in the conductive state, which enables evacuating positive charges. Buried layer 3 remains slightly positively biased.

Thus, as discussed previously, the memory effect of a cell according to the present invention is characterized by a difference between a current at state 1 and a current at state 0 for a given drain-source biasing and for a given gate voltage.

SUMMARY OF THE INVENTION

An object of the present invention is to improve this memory effect.

To achieve this and other objects, the present invention provides specific structures of memory cells comprising a transistor with a body isolated by a junction.

More specifically, the present invention provides a memory cell with a transistor on a floating body region isolated by its lower surface by a junction, in which said junction is non-planar.

According to an embodiment of the present invention, said junction comprises a protrusion directed towards the transistor surface.

According to an embodiment of the present invention, said protrusion protrudes towards the gate substantially under the gate region of the transistor. This protrusion may result from an implantation performed with a mask substantially complementary to the gate mask.

According to an embodiment of the present invention, the memory cell is laterally insulated by trenches comprising an upper portion having a width corresponding to the normal width of trenches in the selected manufacturing technology and a narrower lower portion substantially centered on the upper portion, said junction exhibiting a peripheral upward protrusion at the level of the lower trench portion. This memory cell may be obtained by forming first shallow openings and by coating their lateral walls with spacers, by forming second deeper openings, using said spacers as a mask, by filling the openings, and by performing an implantation partially masked by the upper portion of the filled openings.

The present invention also aims at an integrated circuit containing a memory cell such as mentioned hereabove.

The foregoing and other objects, features, and advantages, of the present invention will be discussed in detail in the following non-limiting description of specific embodiments in connection with the accompanying drawings.

BRIEF DESCRIPTION OF THE DRAWINGS

FIG. 1 shows a memory cell with a transistor on a floating body;

FIG. 2 is a table illustrating examples of voltages applied to the cell of FIG. 1 in different states;

FIG. 3A shows the structure of FIG. 1 in the hold state after writing of a state 1;

FIG. 3B shows the structure of FIG. 1 in the hold state after writing of a state 0;

DETAILED DESCRIPTION

As usual in the representation of integrated circuits, the various cross-section views are not drawn to scale.

Figure 4:
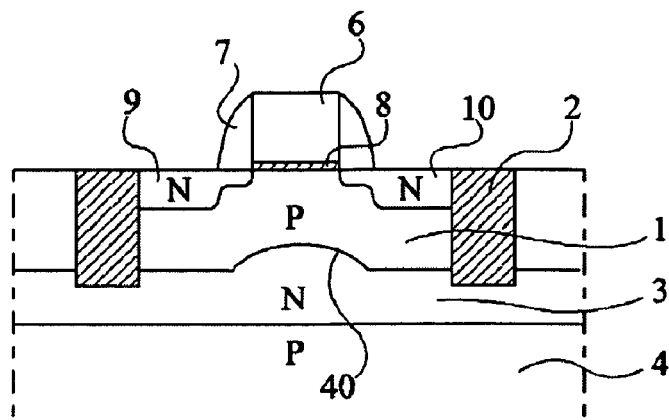
FIG. 4 is a cross-section view of a cell according to an embodiment of the present invention.

FIG. 4 shows, in a simplified cross-section view, an example of a memory cell with a transistor on a floating body according to an embodiment of the present invention. In this drawing, the same elements as in FIG. 1 are designated with the same reference numerals. In this cross-section view, no conductive area enabling creating a contact with buried layer 3, said contact being outside of the plane of the drawing or being common to a cell block, has been shown.

In this embodiment of the present invention, the junction surface between floating body 1 and buried layer 3 is non-planar. It exhibits a protrusion 40 substantially under the gate area of the MOS transistor. This results in increasing the junction surface with respect to the prior art case illustrated in FIG. 1 where the junction is planar.

The inventors have shown that such an increase in the junction surface between the floating body region and the buried layer would lead to an increase in the floating body voltage after the writing of a 1 and in a decrease in this voltage after the writing of a 0, and thus in an increase in the difference between the voltage of the floating body at state 1 and its voltage at state 0; that is, there is an increase in the amplitude of the memory effect of the cell. This increase translates as a significant increase in the ratio between the current read after writing of a 1 and the current read after writing of a 0.

This increase becomes larger as the protrusion under the gate region becomes larger. Indeed, as seen previously, in relation with FIGS. 3A and 3B, charges are stored at the level of the considered junction and the increasing closeness between these charges and the junction area results in a more significant variation in the threshold voltage of the transistor between state 1 and state 0.

In the case where the total thickness of body region 1 between its junction with buried layer 3 and the upper surface is on the order of 300 nm, the protrusion may have a height on the order of 100 nm. These dimensions are given in the context of the previous example corresponding to the voltage values indicated in the table of FIG. 2. The difference between the read currents of a state 1 and of a state 0 is then increased by approximately 30%.

FIGS. 5A to 5D illustrate successive steps of the manufacturing of an example of embodiment of the memory cell of FIG. 4.

Figure 5A:
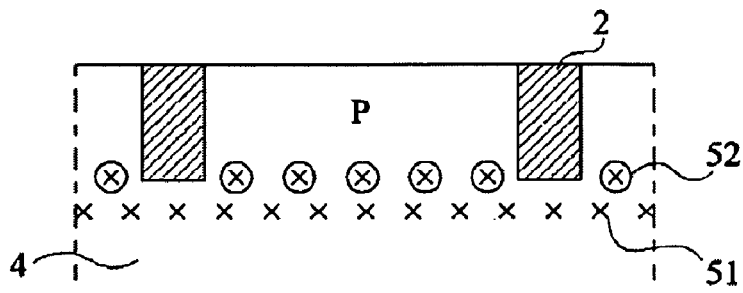
FIGS. 5A to 5D show examples of steps of manufacturing of the cell of FIG. 4.

FIG. 5A is a cross-section view of a portion of a P-type silicon substrate 4 comprising an active area delimited by a trench 2 filled with an insulator, currently silicon oxide. To form the buried layer, a high-energy implantation of N-type dopants such as phosphorus or arsenic is performed. This implantation may be performed in two steps. Dopants 51, substantially crossing the silicon and the insulator filling trenches 2 are implanted at high energy. Dopants 52 of same conductivity type N, possibly identical to dopants 51, are also implanted with a relatively lower energy such that they do not cross insulating regions 2. This enables better adjusting the dopings. Possibly, dopants 51 and 52 are implanted through different masks.

Figure 5B:
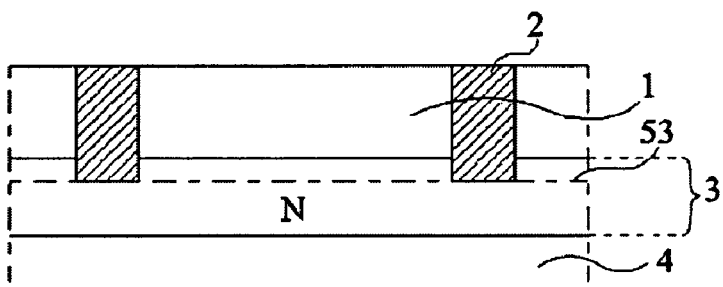

The structure illustrated in FIG. 5B comprising buried layer 3 having a junction surface substantially planar with body region 1 is thus obtained. The approximate limit 53 between the doped region resulting from dopants 51 and that resulting from dopants 52 has been shown in FIG. 5B but, in practice, these regions interpenetrate.

Figure 5C:
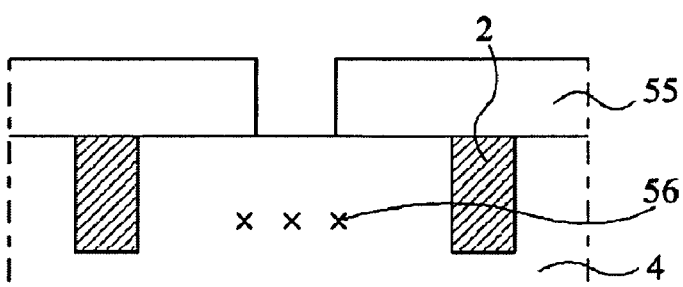

FIG. 5C illustrates an implantation step performed according to the present invention. In this step, a mask 55 for example having a shape substantially complementary to that of the mask which will be subsequently used to define gate 6 of the MOS transistor is formed on the structure. Through this mask, an implantation of dopants 56 is performed at a lower energy than those previously-described to implant dopants 51 and 52. Dopants 56 are located substantially at the center of the body of the MOS transistor, substantially under the gate.

Figure 5D:
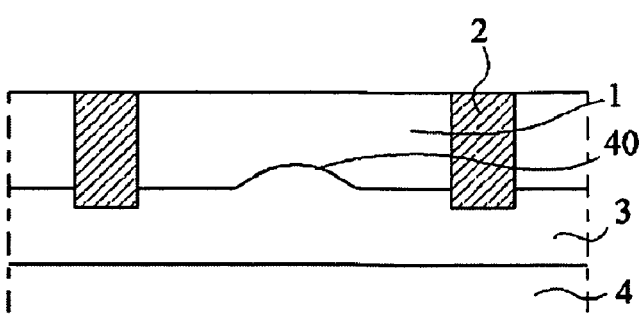

The structure of FIG. 5D in which implanted layer 3 comprises a protrusion 40 substantially under the gate of the MOS transistor is thus obtained.

The various implantation steps illustrated in FIGS. 5A and 5C may be performed in any order, the final shape schematically illustrated in FIG. 5D resulting from all the anneals performed on complete manufacturing of an integrated circuit containing the shown cell.

Figure 6:
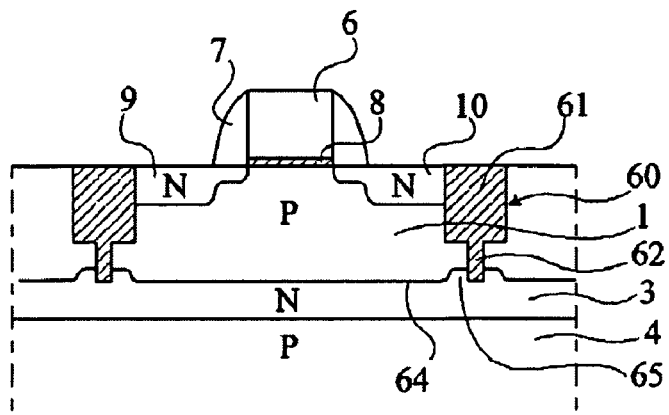
FIG. 6 shows a memory cell according to a second embodiment of the present invention.

FIG. 6 shows a second embodiment of the present invention in which junction 64 between floating body 1 and buried layer 3 is widened by selection of a specific shape of the insulating trenches surrounding the active areas in which the MOS transistors are formed. As illustrated in FIG. 6, trenches 60 comprise an upper portion 61 having a depth much smaller than the depth of previously-described trenches 2. The upper portion of trench 61, which further has the minimum possible width in the considered technology, as was the case for the trenches previously described in relation with FIGS. 1 and 4, is continued by a much narrower trench 62 forming the lower portion of trench 60. The total depth of trench 61-62 is of the same order of magnitude as the total depth of previously-described trenches 2. The depth of upper portion 61 is greater than the junction depth of drain and source regions 9 and 10 but smaller than the junction depth between floating body region 1 and buried layer 3.

FIG. 6 illustrates the shape of junction 64 between floating body 1 and buried layer 3 when an implantation is performed after forming of the trenches filled with oxide 61 and 62. This shape results from the fact that an insulator such as oxide slows an implantation more than silicon. Junction 64 is non-planar and exhibits a lateral rise 65. This enables increasing the junction surface area and thus the charge storage possibility. (It should be noted that, in FIG. 6, no more than in the previous and next drawings, the shape of the junction between buried layer 3 and substrate 4 has been taken into account, this shape having no incidence on the operation of the memory cells considered herein).

It will be within the abilities of those skilled in the art to optimize peripheral rise 65 of junction 64 to obtain a significant increase in the junction surface area.

FIGS. 7A to 7D illustrate steps of an example of the forming of the structure of FIG. 6.

Figure 7A:
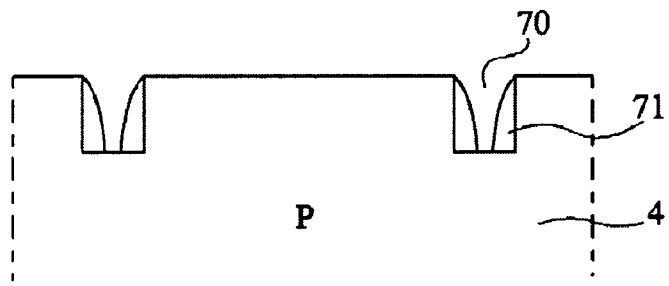
FIGS. 7A to 7D show examples of manufacturing steps of the structure of FIG. 6.

As illustrated in FIG. 7A, it is started from a P-type substrate 4 in which openings 70 corresponding to the periphery of an active area are formed. The walls of openings 70 are coated with a spacer 71 in any known manner. This spacer preferably is made of an insulating material or comprises at least in its portion in contact with the trench wall an insulating material.

Figure 7B:
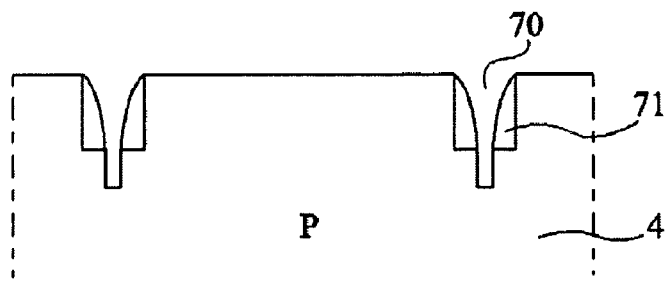

At the next step, illustrated in FIG. 7B, the trench bottom is re-etched by an anisotropic etch delimited by spacers 71, a mask, not shown, protecting the active areas between openings 70.

Figure 7C:
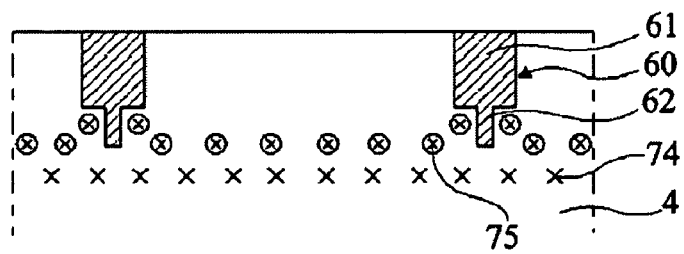

At the step illustrated in FIG. 7C, the trenches are filled with an insulating material or, as previously indicated, the trench walls are coated with insulating materials or oxidized and the trenches are filled with a non-insulating material such as polysilicon if this is simpler in the considered manufacturing technology. Trenches 60 filled with an insulator having a wider upper portion 61 and a narrower lower portion 62 such as illustrated in FIG. 6 are thus obtained. Two successive implantations of an N-type dopant (the same dopant or different dopants) are then performed, the first dopant(s) 74 being implanted at a sufficient energy to penetrate under the trench bottom and second dopant 75 being substantially implanted at the level of the bottom of upper portion 61 of trench 60 and being masked by the lateral overflow of upper portion 61 of the trench with respect to lower portion 62.

Figure 7D:
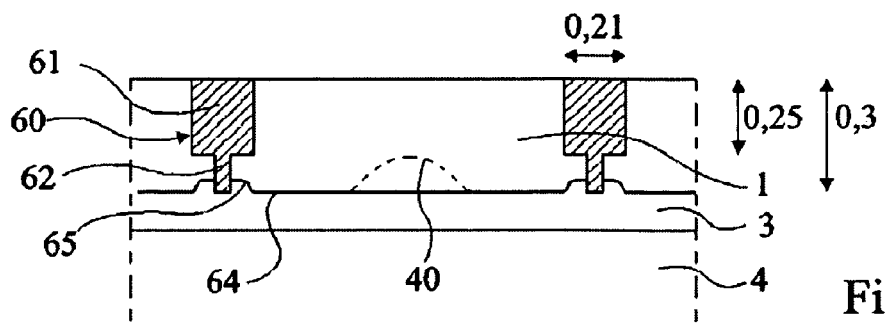

Thus, after anneal, a structure of the type illustrated in FIG. 7D, corresponding to the structure of FIG. 6, is obtained.

A central protrusion has been designated with a dotted line 40 to specify that the embodiments described in relation with FIGS. 4 and 6 may be combined.

Although two particularly advantageous embodiments of the present invention have been described, it should be noted that the present invention generally aims at the forming of a non-planar junction between the body region of a memory cell with a MOS transistor on an isolated body and various other variations may be envisaged to obtain this result, which has the advantage of increasing the memory effect of a cell of the considered type.

The present invention is likely to have various alterations, modifications, and improvements which will occur to those skilled in the art. In particular, the various materials used and the indicated dimensions may be modified according to the used technology, provided that the described functions are achieved. Further, although an N-channel MOS transistor has been described, the memory cell may comprise a P-channel MOS transistor, the conductivity types and the polarities of the charges being accordingly modified.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A memory cell with one transistor on a floating body region isolated by its lower surface by a junction, in which said junction is non-planar, further comprising an isolating ring around the floating body region, the isolating ring having an upper portion with a first width and a lower portion with a second width that is less than the first width, wherein said junction exhibits a peripheral upward protrusion at a level of the lower portion of the isolating ring.

2. A method for manufacturing the memory cell of claim 1, comprising the steps of:
    forming first shallow openings and coating their lateral walls with spacers;
    forming second deeper openings, using said spacers as a mask,
    filling the openings, and
    performing an implantation partially masked by the upper portion of the filled openings.

3. An integrated circuit comprising the memory cell of claim 1.

4. The memory cell of claim 1, wherein said junction comprises a protrusion directed towards the transistor surface.

5. The memory cell of claim 4, wherein said protrusion protrudes towards the gate substantially under the gate region of the transistor.

6. A method for manufacturing a memory cell with one transistor on a floating body region isolated by its lower surface by a junction, in which said junction is non-planar, wherein said junction comprises a protrusion directed toward a transistor surface, wherein said protrusion protrudes toward a gate substantially under a gate region of the transistor, wherein said protrusion results from an implantation performed with a mask substantially complementary to a gate mask used to define the gate of the transistor.

7. A semiconductor memory cell comprising:
    a buried layer of a first conductivity type on a substrate;
    a floating body region of a second conductivity type on the buried layer, a junction between the floating body region and the buried layer being non-planar;
    a transistor on the floating body region; and
    an isolating ring around the floating body region, the isolating ring having an upper portion with a first width and a lower portion with a second width that is less than the first width, wherein the junction is located at a level of the lower portion of the isolating ring.

8. A semiconductor memory cell as defined in claim 7, wherein the junction comprises a protrusion directed toward the transistor.

9. A semiconductor memory cell as defined in claim 8, wherein the transistor includes a gate region and wherein the protrusion is located under the gate region of the transistor.

10. A method for manufacturing a semiconductor memory cell, comprising:
    forming a buried layer of a first conductivity type on a substrate;
    forming a floating body region of a second conductivity type on the buried layer;
    forming a non-planar junction between the floating body region and the buried layer; and
    forming a transistor on the floating body region; and
    forming an isolating ring around the floating body region, the isolating ring having an upper portion with a first width and a lower portion with a second width less than the first width, wherein the non-planar junction is formed at a level of the lower portion of the isolating ring.

11. A method as defined in claim 10, wherein forming an isolating ring comprises:
    forming first shallow openings and coating their lateral walls with spacers;
    forming second deeper openings using the spacers as a mask;
    filling the first and second openings; and
    performing an implantation partially masked by an upper portion of the filled openings.

12. A method as defined in claim 10, wherein forming a non-planar junction comprises forming a junction having a protrusion directed toward the transistor.

13. A method as defined in claim 12, wherein the transistor has a gate region and wherein forming a non-planar junction comprises forming the protrusion under the gate region of the transistor.

14. A method as defined in claim 12, wherein forming a non-planar junction comprises implantation through a mask.

15. A method as defined in claim 14, wherein the mask is complementary to a mask used to form a gate of the transistor.

* * * * *